(12) United States Patent
Fu

(10) Patent No.: US 10,561,017 B1
(45) Date of Patent: Feb. 11, 2020

(54) CIRCUIT BOARD AND METHOD FOR MANUFACTURING THE SAME

(71) Applicants: HongQiSheng Precision Electronics (QinHuangDao) Co.,Ltd., Qinhuangdao (CN); Avary Holding (Shenzhen) Co., Limited., Shenzhen (CN)

(72) Inventor: Chih-Chieh Fu, New Taipei (TW)

(73) Assignees: HongQiSheng Precision Electronics (QinHuangDao) Co., Ltd., Qinhuangdao (CN); Avary Holding (Shenzhen) Co., Limited., Shenzhen (CN)

( * ) Notice: Subject to any disclaimer, the term of this patent is extended or adjusted under 35 U.S.C. 154(b) by 0 days.

(21) Appl. No.: 16/521,673

(22) Filed: Jul. 25, 2019

(30) Foreign Application Priority Data

Jun. 18, 2019 (CN) .......................... 2019 1 0526637

(51) Int. Cl.
  *H05K 3/38* (2006.01)
  *H05K 1/02* (2006.01)
  *H05K 3/46* (2006.01)

(52) U.S. Cl.
  CPC ............. *H05K 1/0298* (2013.01); *H05K 3/38* (2013.01); *H05K 3/4602* (2013.01)

(58) Field of Classification Search
  CPC ....... H05K 1/0298; H05K 3/38; H05K 3/4602
  USPC .................. 174/250, 255, 258, 262; 361/767
  See application file for complete search history.

(56) References Cited

U.S. PATENT DOCUMENTS

| 8,555,494 B2 * | 10/2013 | Jomaa ................. | H05K 3/4682 174/262 |
| 2009/0020319 A1 * | 1/2009 | Yamada .............. | H05K 3/4617 174/255 |
| 2010/0126765 A1 * | 5/2010 | Kim ..................... | H05K 3/4007 174/262 |
| 2015/0195907 A1 * | 7/2015 | Chung ................ | H05K 1/0271 174/258 |

\* cited by examiner

*Primary Examiner* — Sherman Ng
(74) *Attorney, Agent, or Firm* — ScienBiziP, P.C.

(57) ABSTRACT

A circuit board includes a first wiring layer and a build-up structure. The build-up structure includes at least one dielectric layer and at least one second wiring layer. Each dielectric layer and each second wiring layer are alternately arranged. The at least one dielectric layer comprises an outermost dielectric layer. The at least one second wiring layer is formed on a side of the outermost dielectric layer, and comprises an outermost second wiring layer. A portion of the first wiring layer is embedded in a side of the outermost dielectric layer facing away the outermost second wiring layer, a remaining portion of the first wiring layer protrudes from the outermost dielectric layer. A method for manufacturing a circuit board is provided.

13 Claims, 9 Drawing Sheets

CIRCUIT BOARD AND METHOD FOR MANUFACTURING THE SAME

FIELD

The subject matter herein generally relates to a circuit board and a method for manufacturing the circuit board.

BACKGROUND

In reducing a size of the circuit board, some wiring layers may be completely buried in a dielectric layer. If the buried wiring layers need to be soldered to other electronic elements, a high precision of soldering is required to achieve contact since the wiring layers are completely buried in a dielectric layer.

BRIEF DESCRIPTION OF THE DRAWINGS

Implementations of the present disclosure will now be described, by way of embodiments, with reference to the attached figures.

DETAILED DESCRIPTION

Figure 1:
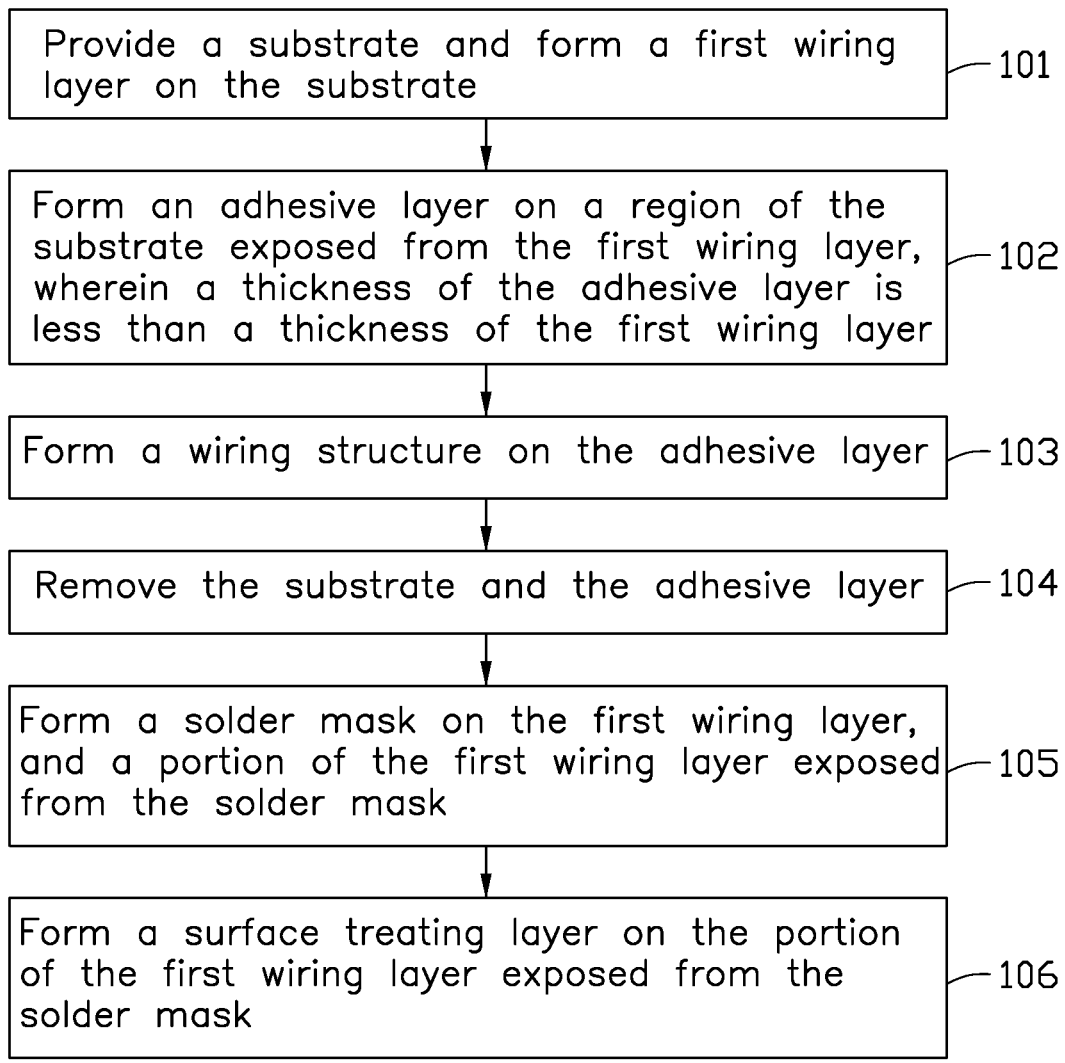
FIG. 1 is a flowchart of an embodiment of a method for manufacturing a circuit board.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

FIG. 1 illustrates a flowchart of a method in accordance with an embodiment. The method for manufacturing a circuit board 100 (shown in FIG. 12) is provided by way of embodiments, as there are a variety of ways to carry out the method. Each block shown in FIG. 1 represents one or more processes, methods, or subroutines carried out in the method. Furthermore, the illustrated order of blocks can be changed. Additional blocks may be added or fewer blocks may be utilized, without departing from this disclosure. The method can begin at block 101.

Figure 2:
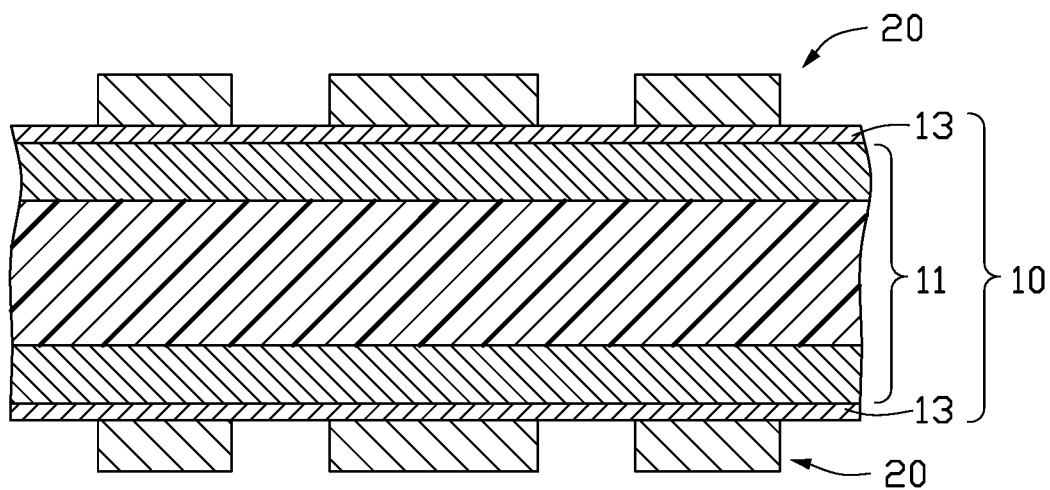
FIG. 2 is a cross-sectional view showing a first wiring layer formed on a substrate.

At block 101, referring to FIG. 2, a substrate 10 is provided, and a first wiring layer 20 is formed on the substrate 10.

In at least one embodiment, the first wiring layer 20 is formed on opposite sides of the substrate 10. In another embodiment, the first wiring layer 20 is formed on one side of the substrate 10.

Figure 3:
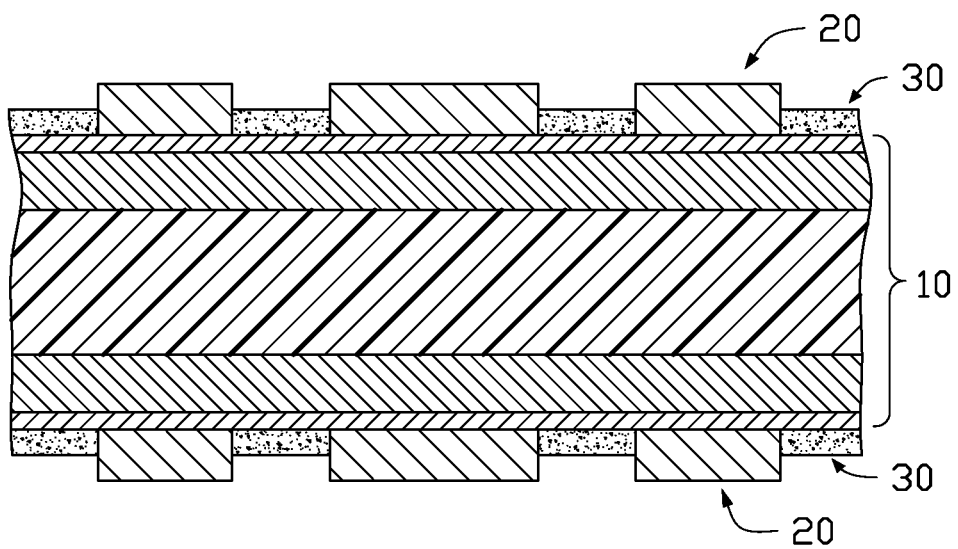
FIG. 3 is a cross-sectional view showing an adhesive layer formed on a region of the substrate of FIG. 2.
Figure 4:
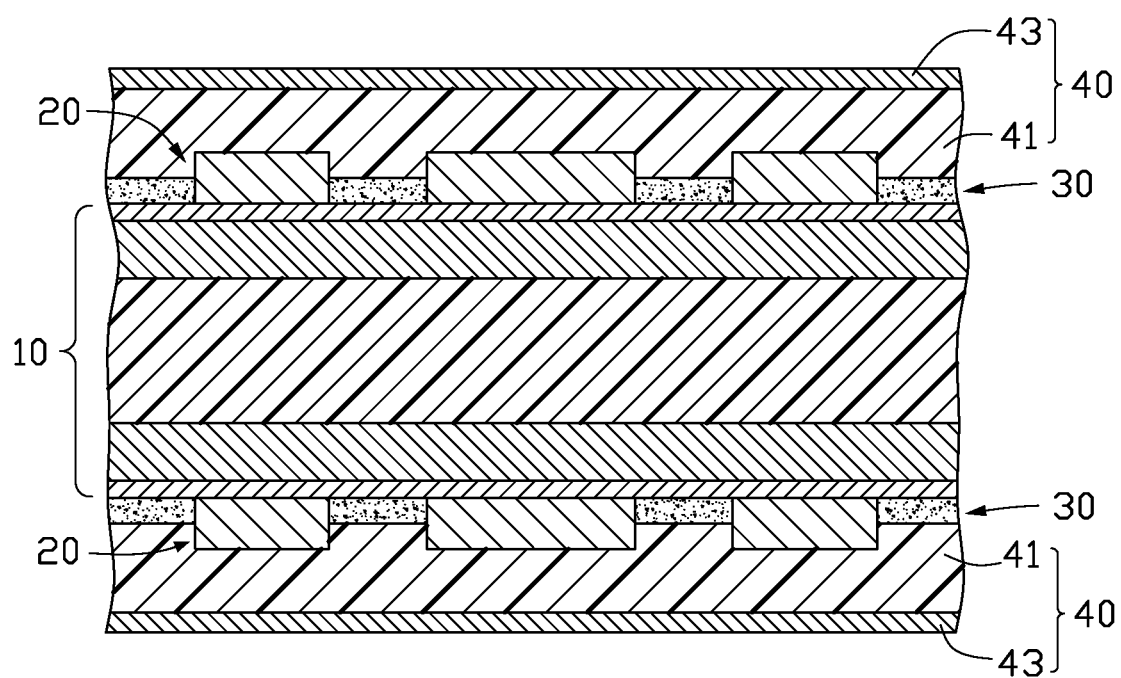
FIGS. 4-7 are cross-sectional views of illustrating respective steps of an embodiment of a method for manufacturing a build-up structure on the adhesive layer of FIG. 3.
Figure 5:
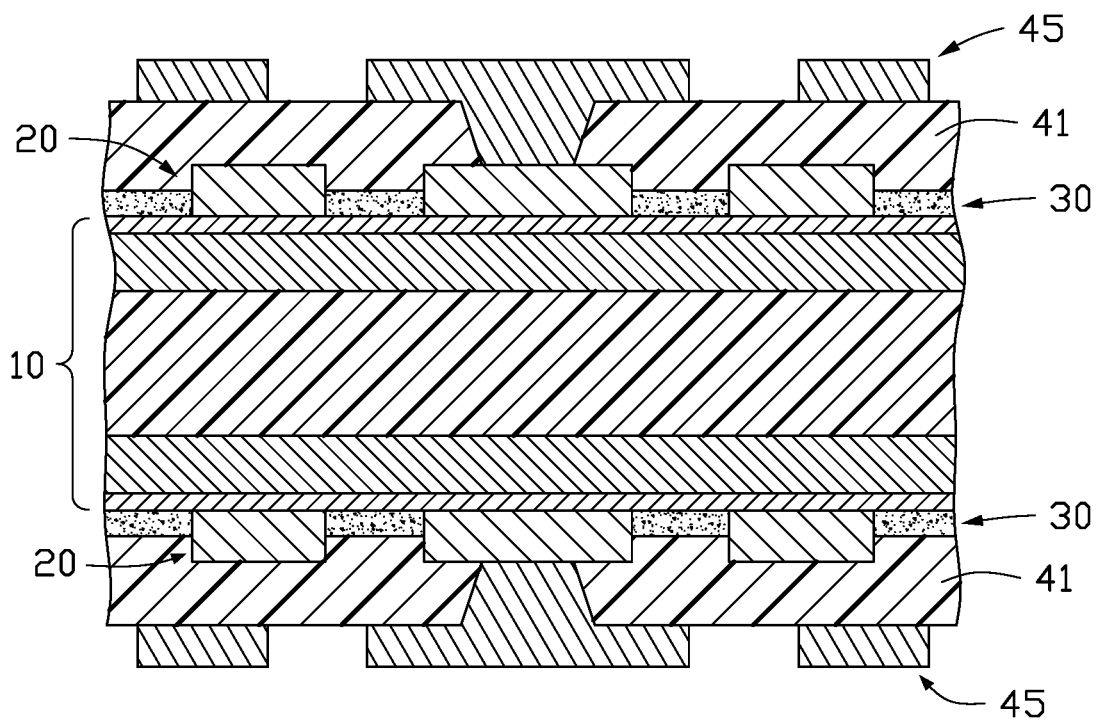
Figure 6:
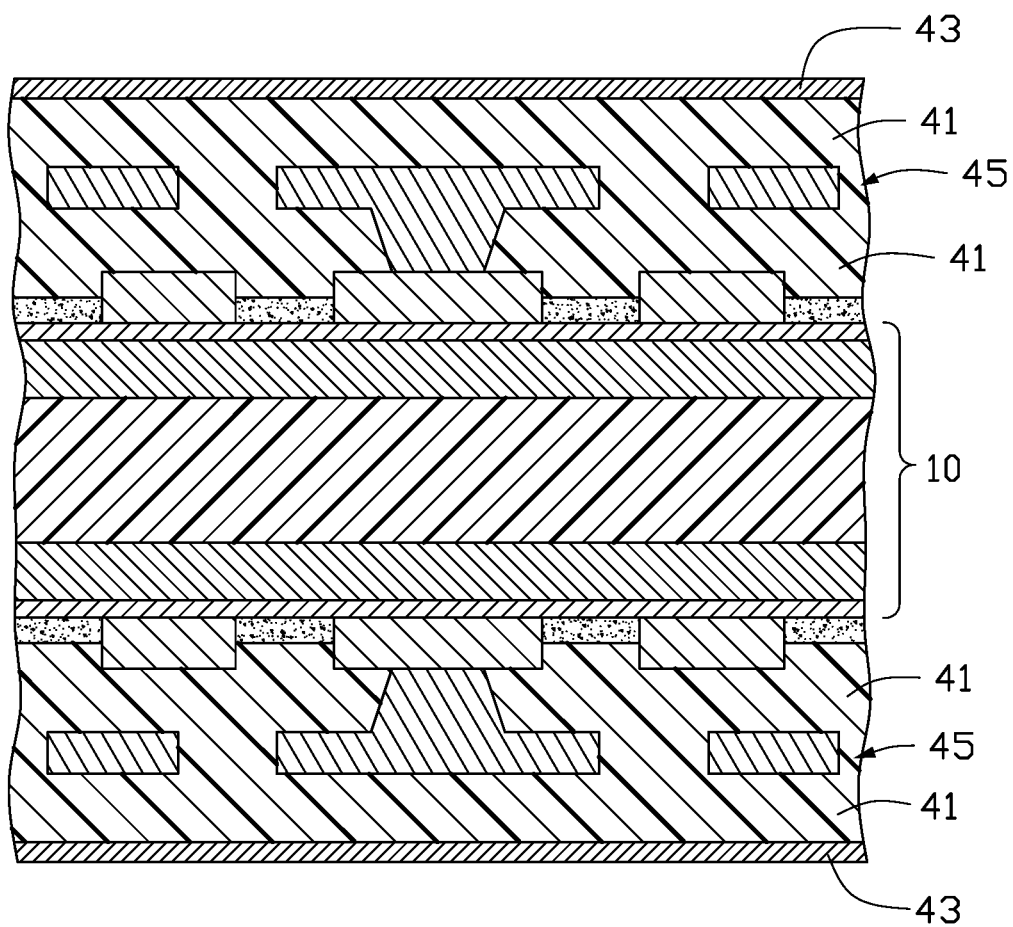
Figure 7:
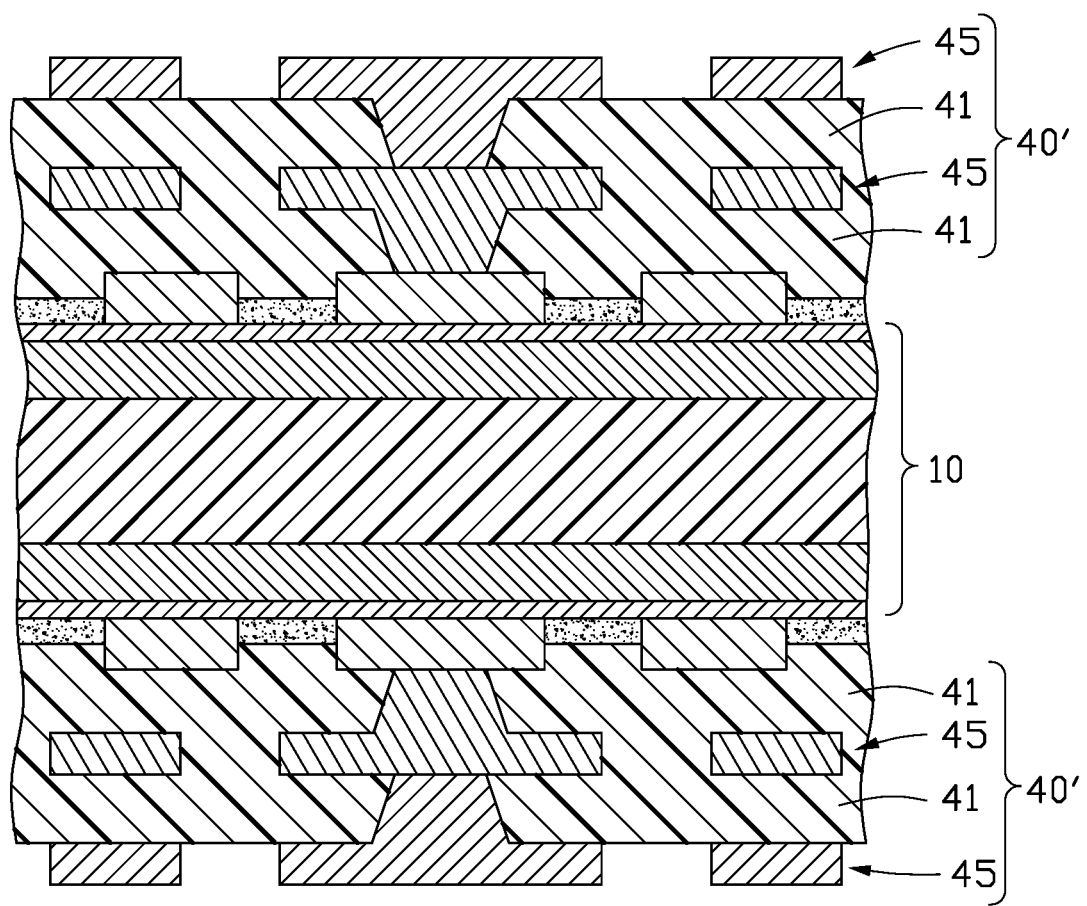

At block 102, referring to FIG. 3, an adhesive layer 30 is formed on the substrate 10, the first wiring layer 20 is exposed from the adhesive layer 30. A thickness of the adhesive layer 30 is less than a thickness of the first wiring layer 20. A portion of the first wiring layer 20 is embedded in the adhesive layer 30, and a remaining portion of the first wiring layer 20 protrudes from the adhesive layer 30.

In at least one embodiment, the adhesive layer 30 may be made of a thermally decomposable material. The thermally decomposable material may be composed of polymer and thermally expandable microspheres. The thermally expandable microsphere may be a material that can be vaporized or expanded by heating. For example, the thermally expandable microspheres may include isobutene, propane, or pentane. An internal structure of the pyrolytic glue is destroyed when the thermally expandable microspheres are expanded by heating so the cohesiveness of the adhesive layer 30 is lost. Nothing of the thermally decomposable material remains on a surface of metal foil when the thermally decomposable material is decomposed by a high temperature. In at least one embodiment, a pyrolytic temperature of the thermally decomposable material is between 200 degrees Celsius and 300 degrees Celsius.

In another embodiment, the adhesive layer 30 may be made of other materials.

At block 103, referring to FIGS. 4, 5, 6, and 7, a build-up structure 40' is formed on a side of the adhesive layer 30 facing away from the substrate 10 to cover the first wiring layer 20 and the adhesive layer 30. The build-up structure 40' includes at least one dielectric layer 41 and at least one second wiring layer 45. Each dielectric layer 41 and each second wiring layer 45 are alternately arranged. The at least one dielectric 41 includes an outermost dielectric layer, the at least one second wiring layer 45 includes an outermost second wiring layer.

In at least one embodiment, the build-up structure 40' includes two dielectric layers 41 and two second wiring layers 45. One dielectric layer 41 and one second wiring layer 45 form a first assembly, and another dielectric layer 41 and another second wiring layer 45 form a second assembly. The second wiring layer 45 of the first assembly is sandwiched between the two dielectric layers 41. The dielectric layer 41 of the first assembly is the outermost dielectric layer, covers the first wiring layer 20 and the adhesive layer 30, and infills in gaps of the first wiring layer 20 protruding from the adhesive layer. The first wiring layer 20 and the adhesive layer 30 are thus sandwiched between the dielectric layer 41 of the first assembly and the substrate

10. The remaining portion of the first wiring layer 20 protruding from the adhesive layer 30 is embedded in the outermost dielectric layer. The second wiring layer 45 of the second assembly is the outermost second wiring layer.

In at least one embodiment, a first laminated board 40 is provided and is hot pressed and bonded to the first wiring layer 20 and the adhesive layer 30. The first laminated board 40 is used to form a first assembly.

In the illustrated embodiment, a temperature of the hot pressing is less than the pyrolytic temperature of the pyrolytic glue. Preferably, the temperature of the hot pressing is between 200 degrees Celsius and 220 degrees Celsius.

In at least one embodiment, the first laminated board 40 includes a dielectric layer 41 and a first copper foil 43 formed on a surface of the dielectric layer 41. The dielectric layer 41 facing away from the first copper foil 43 is combined with the first wiring layer 20 and the adhesive layer 30. A fluidity of the dielectric layer 41 increases during the hot pressing, and the dielectric layer 41 infills the gap of the first wiring layer 20 above the adhesive layer 30. Therefore, a portion of the first wiring layer 20 is embedded in the dielectric layer 41. The dielectric layer 41 may be made of a material selected from polypropylene, epoxy resin, polyurethane, phenolic resin, urea resin, melamine-formaldehyde resin, unsaturated polyester resin, polyimide, and any combination thereof.

In at least one embodiment, two first laminated boards 40 are provided and respectively pressed to two sides of the substrate 10 with the first wiring layer 20.

A second wiring layer 45 is formed on a side of the dielectric layer 41 facing away from the substrate 10. The second wiring layer 45 is electrically connected to the first wiring layer 20.

In at least one embodiment, the second wiring layer 45 may be formed by the following steps:

laying a photosensitive film on a surface of the first copper foil 43 facing away from the substrate 10;

forming a mask pattern on the photosensitive film by exposure and development;

forming a wiring pattern corresponding to the mask pattern, by metal plating;

removing the photosensitive film to expose a portion of the first copper foil 43 which is not covered by the wiring pattern; and etching the portion of the first copper foil 43 not covered by the wiring pattern, thereby forming the second wiring layer 45.

Preferably, the wiring pattern is made of copper.

In the illustrated embodiment, a second assembly may be formed in the same manner as the first assembly.

Figure 8:
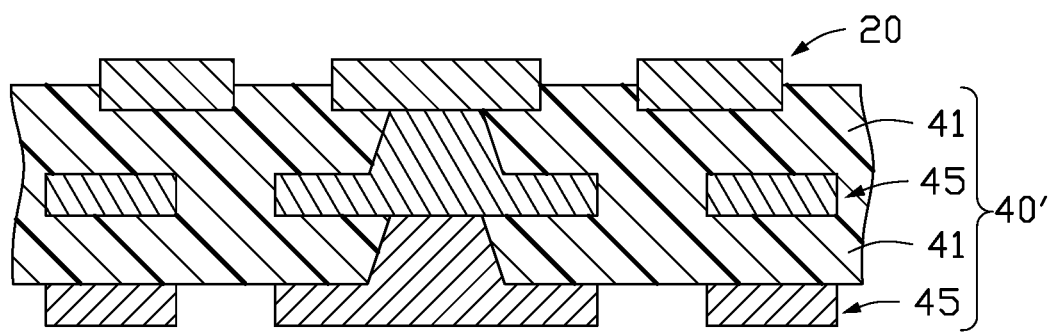
FIG. 8 is a cross-sectional view showing the substrate and the adhesive layer of FIG. 7 removed to obtain a circuit board.

At block 104, referring to FIG. 8, the substrate 10 is removed to expose the first wiring layer 20 and the adhesive layer 30. The circuit board 100 is obtained after removing the adhesive layer 30. In the circuit board 100, a portion of the first wiring layer 20 is embedded in the dielectric layer 41, and the remaining portion of the first wiring layer 20 protrudes from a surface of the dielectric layer 41 facing away from the second wiring layer 45.

In at least one embodiment, the adhesive layer 30 is removed by applying a temperature of about 260 degrees Celsius to about 300 degrees Celsius.

In at least one embodiment, the method may further include the block 105 and the block 106.

Figure 9:
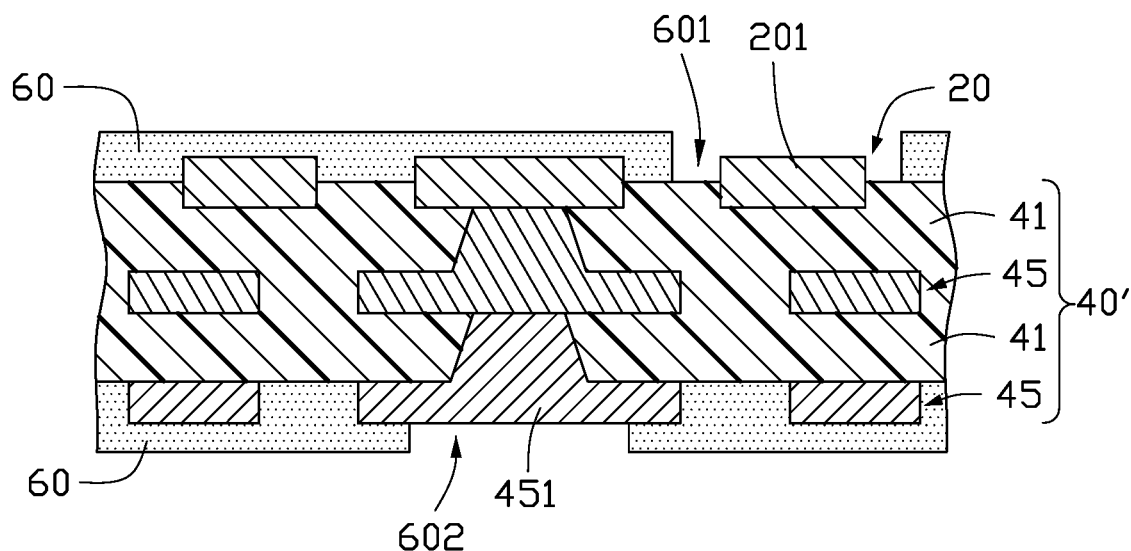
FIG. 9 is a cross-sectional view showing a solder mask formed on the circuit board of FIG. 8.

At block 105, referring to FIG. 9, a solder mask 60 is formed on an outer surface of the circuit board 100, and a portion of the first wiring layer 21 is exposed from the solder mask 60 for connecting other electronic elements.

Specifically, the solder mask 60 is formed on a side of the build-up structure 40' with the first wiring layer 20 to cover the first wiring layer 20, and formed on a side of the build-up structure 40' facing away the first wiring layer 20. The solder mask 60 infills in a gap of the first wiring layer 20 protruding from the outermost dielectric layer, and infills in a whole gap of the outermost second wring layer of the build-up structure 40'. A portion of the first wiring layer 20 and a portion of the outermost second wiring layer 45 are exposed from the solder mask 60 for connecting other electronic elements.

In at least one embodiment, the solder mask 60 defines at least one first opening 601 and at least one second opening 602. The first opening 601 and the second opening 602 are respectively defined on opposite sides of the circuit board 100. Specially, the first opening 601 is defined on the solder mask 60 adjacent to the first wiring layer 20, the second opening 602 is defined on the solder mask 60 adjacent to the outermost second wring layer of the build-up structure 40'.

The first wiring layer 20 may include at least one first connecting pad 201, and the first connecting pad 201 is exposed from the first opening 601 for connecting other electronic elements. The outermost second wiring layer 45 may include at least one second connecting pad 451, and the second connecting pad 451 is exposed from the second opening 602 for connecting other electronic elements.

In at least one embodiment, a portion of each first connecting pad 201 protruding from the outermost dielectric layer is entirely exposed from the first opening 601. A partial surface of each second connecting pad 451 is exposed from the second opening 602, and a remaining surface of each second connecting pad 451 is covered by the solder mask 60.

In at least one embodiment, the first connecting pad 201 is electrically connected to the second connecting pad 451.

In at least one embodiment, a cross-sectional area of the second connecting pad 451 is greater than a cross-sectional area of the first connecting pad 201.

Figure 10:
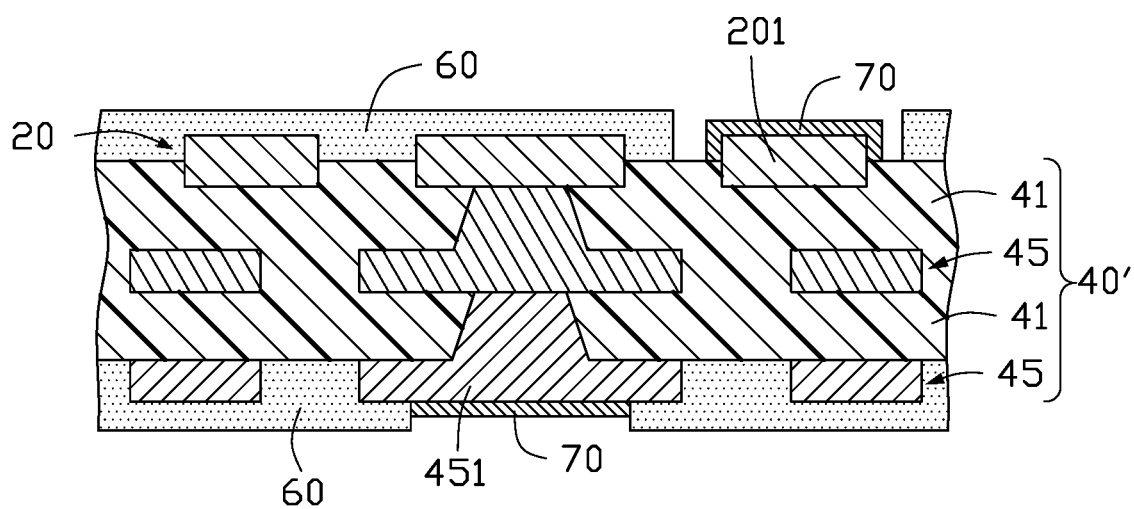
FIG. 10 is a cross-sectional view showing a surface treating layer formed on the portion of the first wiring layer exposed from the solder mask of FIG. 9.

At block 106, referring to FIG. 10, a surface treating layer 70 is formed on the portion of the first wiring layer 20 exposed from the solder mask 60.

In at least one embodiment, the surface treating layer 70 is formed on the exposed of the portion of the first wiring layer 20 and the exposed portion of the outermost second wiring layer 45 by Electroless Nickel Immersion Gold (ENIG).

The surface treating layer 70 is formed on a surface of the first connecting pad 201 exposed from the solder mask 60 and a surface of the second connecting pad 451 exposed from the solder mask 60.

In at least one embodiment, referring to FIG. 2, the substrate 10 in the block 101 may include a base 11 and a metal layer 13 formed on opposite surfaces of the base 11. The first wiring layer 20 is formed on a surface of the metal layer 13 facing away from the base 11.

Figure 11:
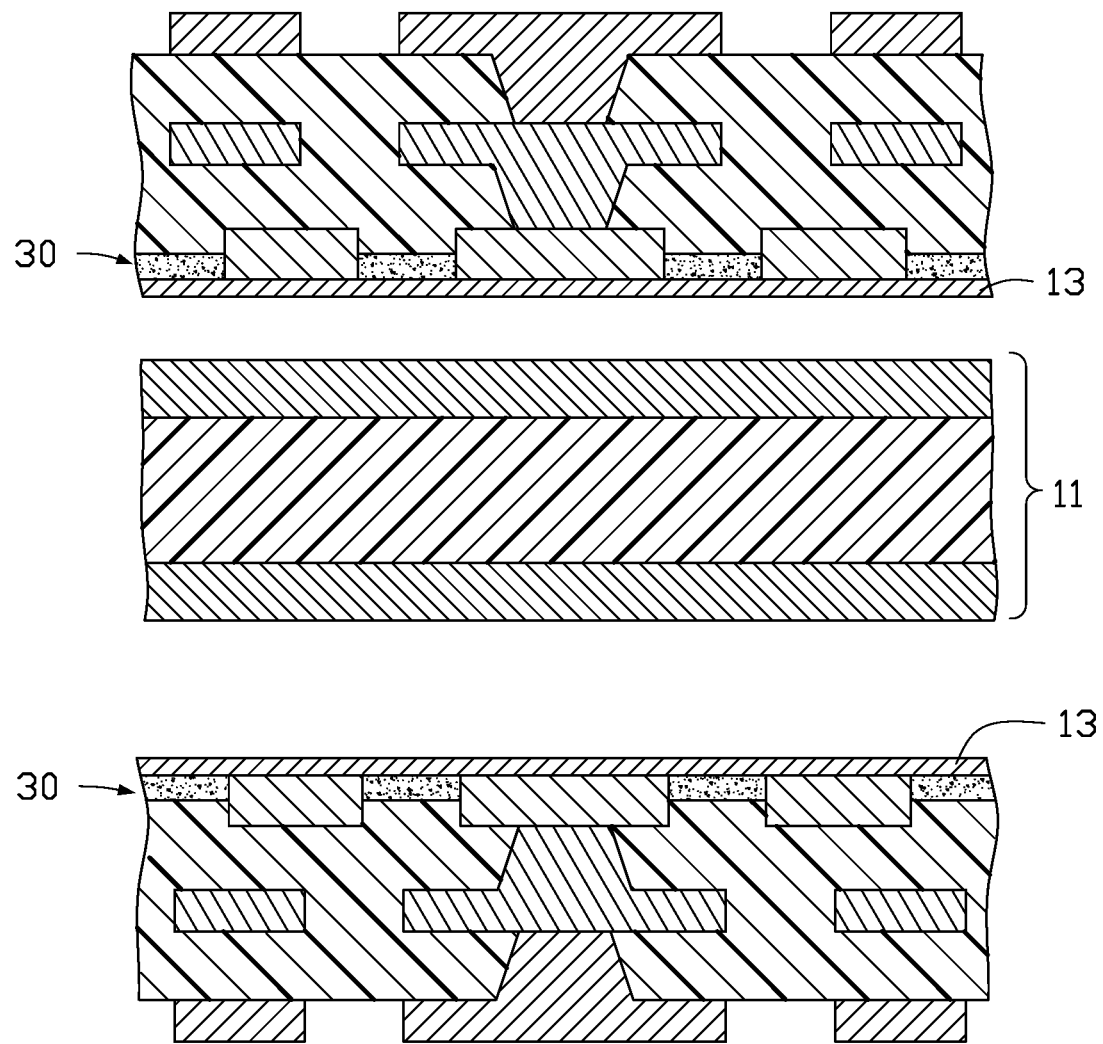
FIG. 11 is a cross-sectional view showing a base of the substrate separated from a metal layer of the substrate of FIG. 7.
Figure 12:
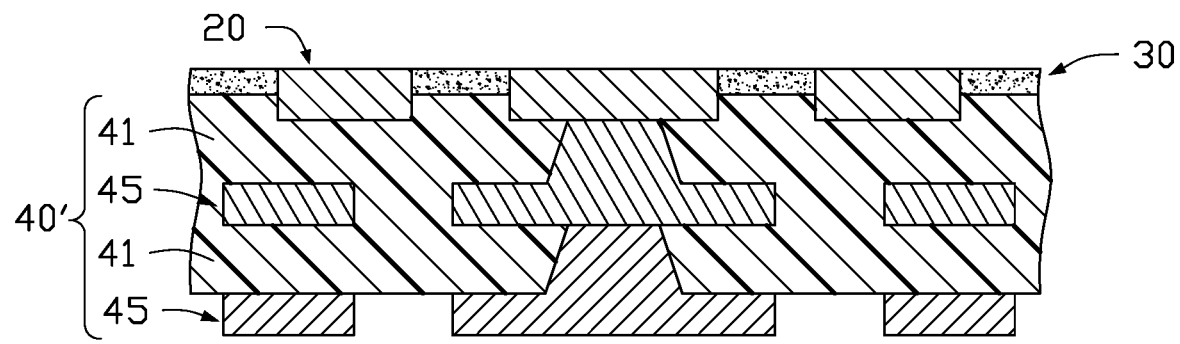
FIG. 12 is a cross-sectional view showing the metal layer of FIG. 11 removed.

In at least one embodiment, the substrate 10 and the adhesive layer 30 are removed by the following steps:

referring to FIG. 11, separating the base 11 from the metal layer 13;

referring to FIG. 12, removing the metal layer 13 by etching, to expose the first wiring layer 20 and the adhesive layer 30; and heating and removing the adhesive layer 30.

In at least one embodiment, the first wiring layer 20 may be formed by the following steps:

pressing a photosensitive film (not shown) on each opposite side of the substrate 10;

forming a mask pattern on the photosensitive film by exposure and development;

forming a first wiring layer 20 corresponding to the mask pattern by metal plating; and removing the photosensitive film.

Depending on the embodiment, certain of the steps of methods described may be removed, others may be added, and the sequence of steps may be altered. It is also to be understood that the description and the claims drawn to a method may include some indication in reference to sequential steps. However, the indication used is only to be viewed for identification purposes and not as a suggestion as to an order for the steps.

Figure 13:
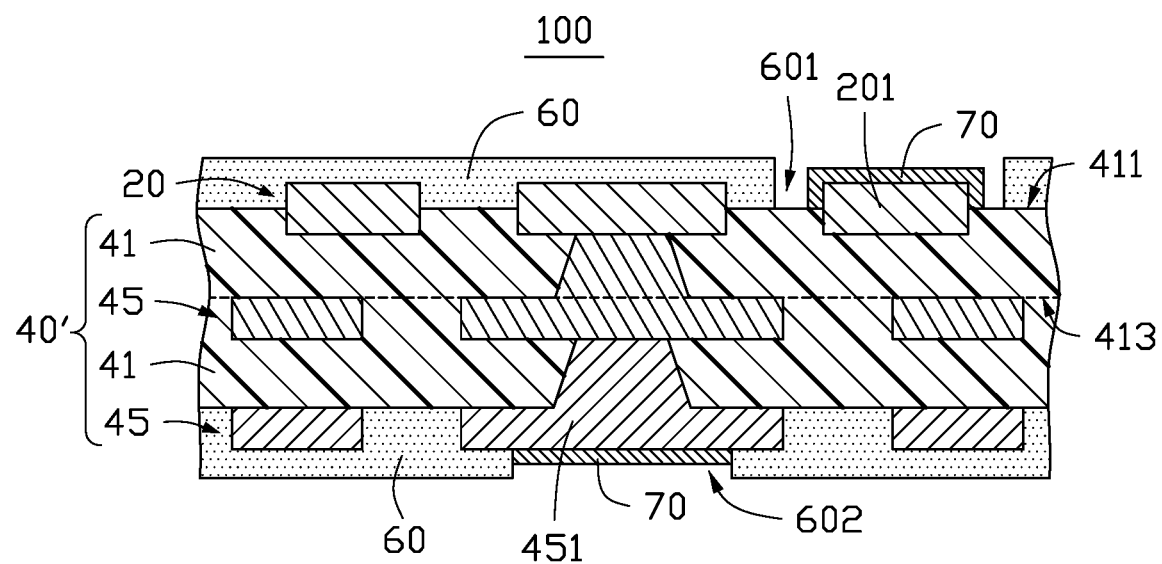
FIG. 13 is a cross-sectional view of an embodiment of a circuit board.

FIG. 13 illustrates an embodiment of a circuit board 100. The circuit board 100 includes a first wiring layer 20 and a build-up structure 40'. The build-up structure 40' includes at least one dielectric layer 41 and at least one second wiring layer 45. Each dielectric layer 41 and each second wiring layer 45 are alternately arranged. The at least one dielectric layer 41 includes an outermost dielectric layer. The at least one second wiring layer 45s formed on a side of the outermost dielectric layer, and includes an outermost second wiring layer. The outermost dielectric layer 41 of the build-up structure 40' includes a first surface 411 and a second surface 413 facing away from the first surface 411. A portion of the first wiring layer 20 is embedded in the outermost dielectric layer 41, and the remaining portion of the first wiring layer 20 protrudes from the first surface 411. The second wiring layer 45 is disposed on the second surface 413. The first wiring layer 20 is electrically connected to the second wiring layer 45.

Each dielectric layer 41 may be made of a material selected from polypropylene, epoxy resin, polyurethane, phenolic resin, urea resin, melamine-formaldehyde resin, unsaturated polyester resin, polyimide, and any combination thereof.

The circuit board 100 may further include a solder mask 60. In at least one embodiment, the solder mask 60 is formed on a side of the build-up structure 40' with the first wiring layer 20 to cover the first wiring layer 20, and formed on a side of the build-up structure 40' facing away the first wiring layer 20. The solder mask 60 infills in a gap of the first wiring layer 20 protruding from the outermost dielectric layer 41, and infills in a whole gap of the outermost second wring layer 45 of the build-up structure 40'. A portion of the first wiring layer 20 and a portion of the outermost second wiring layer 45 are exposed from the solder mask 60.

In at least one embodiment, the solder mask 60 defines at least one first opening 601 and at least one second opening 602. Specially, the first opening 601 is defined on the solder mask 60 adjacent to the first wiring layer 20, the second opening 602 is defined on the solder mask 60 adjacent to the outermost second wring layer of the build-up structure 40'. The first wiring layer 20 may include at least one first connecting pad 201, and the first connecting pad 201 is exposed from the first opening 601. The outermost second wiring layer 45 may include at least one second connecting pad 451, and the second connecting pad 451 is exposed from the second opening 602.

In at least one embodiment, a portion of each first connecting pad 201 protruding from the outermost dielectric layer is entirely exposed from the first opening 601. A partial surface of each second connecting pad 451 is exposed from the second opening 602, and a remaining surface of each second connecting pad 451 is covered by the solder mask 60.

In at least one embodiment, the first connecting pad 201 is electrically connected to the second connecting pad 451.

In at least one embodiment, a cross-sectional area of the second connecting pad 451 is greater than a cross-sectional area of the first connecting pad 201.

The circuit board 100 may further include a surface treating layer 70 formed on the exposed portion of the first wiring layer 20 and the exposed portion of the outermost second wiring layer 45. In the illustrated embodiment, the surface treating layer 70 is formed on the first connecting pad 201 and the second connecting pad 451.

In the method for manufacturing the circuit board 100, the portion of the first wiring layer 20 is embedded in the dielectric layer 41, and the remaining portion of the first wiring layer 20 protrudes from the first surface 411, thereby preventing any deviation in position of the first wiring layer 20 in the subsequent manufacturing process, and facilitating an electrical connection between the first wiring layer 20 and other electronic elements simultaneously. The risk of poor contact caused by the first circuit layer 20 being completely embedded in the dielectric layer 41 is significantly reduced. Further, the adhesive layer 30 made of the pyrolytic glue reduces a residue when removing the adhesive layer 30. The second connecting pad 451 is provided for connecting other electronic elements or circuit boards.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A method for manufacturing a circuit board comprising:

providing a substrate and forming a first wiring layer on the substrate;

forming an adhesive layer on the substrate, and the first wring layer is exposed from the adhesive layer, wherein a thickness of the adhesive layer is less than a thickness of the first wiring layer, a portion of the first wiring layer is embedded in the adhesive layer, and a remaining portion of the first wiring layer protrudes from the adhesive layer;

forming a build-up structure on a side of the adhesive layer facing away from the substrate, the build-up structure covering the first wiring layer and the adhesive layer, wherein the build-up structure comprises at least one dielectric layer and at least one second wiring layer, each of the at least one dielectric layer and each of the at least one second wiring layer are alternately arranged, the at least one dielectric layer comprises an outermost dielectric layer covering the first wiring layer, and infilling in a gap of the first wiring layer protruding from the adhesive layer, the remaining portion of the first wiring layer protruding from the adhesive is embedded in the outermost dielectric layer, the at least one second wiring layer is formed on a side of the outermost dielectric layer away from the substrate, and comprises an outermost second wiring layer; and removing the substrate and the adhesive layer, wherein the portion of the first wiring layer embedded in the adhesive layer is exposed and protruding from the outermost dielectric layer, wherein after removing the substrate and the adhesive layer, the method further comprises: forming a solder mask on the first wiring layer and the outermost second wiring layer of the build-up structure, wherein the solder mask infills in a gap of the first wiring layer protruding from the outermost dielectric layer, and infills in a whole gap of the outermost second wring layer of the build-up structure; defining at least one first opening on the solder mask adjacent to the first wiring layer and at least one second opening on the solder mask adjacent to the outermost second wring layer of the build-up structure, wherein the first wiring layer comprises at least one first connecting pad, a portion of each of the at least one first connecting pad protruding from the outermost dielectric layer is entirely exposed from the at least one first opening.

2. The method for manufacturing a circuit board of claim 1, wherein the outermost second wiring layer comprises at least one second connecting pad, a partial surface of each of the at least one second connecting pad is exposed from the at least one second opening, and a remaining surface of each of the at least one second connecting pad is covered by the solder mask.

3. The method for manufacturing a circuit board of claim 2, wherein the at least one first connecting pad is electrically connected to the at least one second connecting pad.

4. The method for manufacturing a circuit board of claim 2, wherein a cross-sectional area of each of the at least one second connecting pad is greater than a cross-sectional area of each of the at least one the first connecting pad.

5. The method for manufacturing a circuit board of claim 1, wherein the substrate comprises a base and a metal layer formed on two opposite surfaces of the base, the first wiring layer is formed on the metal layer.

6. The method for manufacturing a circuit board of claim 5, wherein removing the substrate and the adhesive layer further comprises:
separating the base from the metal layer;
removing the metal layer by etching to expose the first wiring layer and the adhesive layer; and
removing the adhesive layer.

7. The method for manufacturing a circuit board of claim 1, wherein the adhesive layer is made of a thermally decomposable material.

8. The method for manufacturing a circuit board of claim 7, wherein before removing the adhesive layer, the method further comprises:
heating the adhesive layer.

9. The method for manufacturing a circuit board of claim 7, wherein the thermally decomposable material comprises thermally expandable microspheres, the thermally expandable microspheres can be vaporized by heating.

10. A circuit board comprising:
a first wiring layer; and
a build-up structure disposed on the first wiring layer, comprising:
at least one dielectric layer; and
at least one second wiring layer;
wherein each of the at least one dielectric layer and each of the at least one second wiring layer are alternately arranged; the at least one dielectric layer comprises an outermost dielectric layer, the at least one second wiring layer is formed on a side of the outermost dielectric layer, and comprises an outermost second wiring layer; a portion of the first wiring layer is embedded in a side of the outermost dielectric layer facing away the outermost second wiring layer, a remaining portion of the first wiring layer protrudes from the outermost dielectric layer, wherein the circuit board further comprises a solder mask, the solder mask is disposed on the first wiring layer and the outermost second wiring layer, infills in a gap of the first wiring layer protruding from the outermost dielectric layer, and infills in a whole gap of the outermost second wring layer of the build-up structure, wherein the solder mask on the first wiring layer comprises at least one first opening, the solder mask on the outermost second wring layer comprises at least one second opening, and wherein the first wiring layer comprises at least one first connecting pad, a portion of each of the at least one first connecting pad protruding from the outermost dielectric layer is entirely exposed from the at least one first opening.

11. The circuit board of claim 10, wherein the outermost second wiring layer comprises at least one second connecting pad, a partial surface of each of the at least one second connecting pad is exposed from the at least one second opening, and a remaining surface of each of the at least one second connecting pad is covered by the solder mask.

12. The circuit board of claim 11, the at least one first connecting pad is electrically connected to the at least one second connecting pad.

13. The circuit board of claim 11, wherein a cross-sectional area of each of the at least one second connecting pad is greater than a cross-sectional area of each of the at least one the first connecting pad.

* * * * *